United States Patent
Chen

(10) Patent No.: US 7,907,021 B2
(45) Date of Patent: Mar. 15, 2011

(54) TWO-STEP VCO CALIBRATION METHOD

(75) Inventor: Yi-Lung Chen, Keelung (TW)

(73) Assignee: ISSC Technologies Corp., Hsinchu (TW)

( * ) Notice: Subject to any disclaimer, the term of this patent is extended or adjusted under 35 U.S.C. 154(b) by 243 days.

(21) Appl. No.: 12/204,979

(22) Filed: Sep. 5, 2008

(65) Prior Publication Data

US 2010/0060366 A1    Mar. 11, 2010

(51) Int. Cl.
*G01R 23/00* (2006.01)

(52) U.S. Cl. ............... 331/44; 331/1 R; 331/16; 331/17; 331/34; 331/175; 331/177 R

(58) Field of Classification Search ............ 331/1 R, 331/16, 17, 34, 44, 175, 177 R
See application file for complete search history.

(56) References Cited

U.S. PATENT DOCUMENTS

| | | | |
|---|---|---|---|
| 6,597,249 B2 * | 7/2003 | Chien et al. | 331/177 R |
| 6,859,073 B1 * | 2/2005 | Dai et al. | 327/105 |
| 2006/0145776 A1 * | 7/2006 | Shi et al. | 331/175 |
| 2006/0226916 A1 * | 10/2006 | Florescu et al. | 331/16 |
| 2007/0159261 A1 * | 7/2007 | Lee | 331/16 |
| 2008/0007365 A1 * | 1/2008 | Venuti et al. | 331/179 |
| 2009/0153252 A1 * | 6/2009 | Chen et al. | 331/10 |

* cited by examiner

*Primary Examiner* — Arnold Kinkead
*Assistant Examiner* — Richard Tan
(74) *Attorney, Agent, or Firm* — Muncy, Geissler, Olds & Lowe, PLLC

(57) ABSTRACT

The present invention discloses a two-step VCO calibration method. The two-step VCO calibration method, comprising power-on calibration, used to provide a coarse VCO tuning; real-time calibration, used to provide a fine VCO tuning according to the loaded result of said power-on calibration. The two-step VCO calibration method according to the present invention can cover all the variation of process and temperature and gain the advantages of shorter calibration time, smaller gain of VCO, pretty smaller size of passive loop filter and less operating power consumption.

1 Claim, 4 Drawing Sheets

TWO-STEP VCO CALIBRATION METHOD

BACKGROUND OF THE INVENTION

1. Field of the Invention

The present invention relates to a method to coarse-tune the center frequency of integrated VCO(Voltage Control Oscillator), and more particularly, to a two-step VCO calibration method.

2. Description of the Related Art

In SOC (system on chip) field, all the functional blocks should be integrated to a single chip. Therefore the layout size becomes a critical issue in circuit design. Generally phase lock loop (PLL) block design contains VCO, divider, phase/frequency detector, charge-pump and passive loop filter, and among this block, passive loop filter will occupy the largest area if a medium loop band-width is selected. In order to reduce the die area due to this large capacitor for providing lower frequency pole, the gain of VCO must be lower to afford less use of passive capacitor. On the other hand once the gain of VCO lower, there is no margin for temperature variation of integrated VCO. So, there is the technology of coarse-tuning the center frequency of integrated VCO, which is used to reduce the size of passive loop filter. The smaller the size of passive loop filter is, the easier integrating the loop filter becomes.

In the prior arts, there are two ways to coarse-tune the center frequency of integrated VCO, one is to calibrate the frequency at power-on, the other is to calibrate the frequency at transmit/receive data packets.

However, the first way, calibration at power-on, can cover process variation only. Once the operation temperature varied to high or low, this variation should be recovered by analog PLL. This will lead a large requirement of charge-pump dynamic range. In addition, if the VCO gain isn't flat enough the loop band-width of PLL will be varied by temperature.

The other way, calibration at transmit/receive data packet, is a better method to cover all the variation of process and temperature. Nevertheless, due to the calibration must be done before packet start, an extra and long calibration time should be needed at each packet resulting in the increase of power consumption.

According to the above problems, the related field needs a new method to calibrate the center frequency of integrated VCO to overcome the disadvantages of the prior arts.

SUMMARY OF THE INVENTION

It is an object of the present invention to provide a two-step VCO calibration method. Comparing to the prior arts, the two-step method has the advantages of covering all the variation of process and temperature, shorter calibration time, smaller gain of VCO, pretty smaller size of passive loop filter, less operating power consumption.

To achieve the above goals, the present invention provides a two-step VCO calibration method. The two-step VCO calibration method comprises power-on calibration, used to provide a coarse VCO tuning; real-time calibration, used to provide a fine VCO tuning according to the loaded result of said power-on calibration.

According to one aspect of the two-step VCO calibration method of the present invention, said power-on calibration shall be triggered by one control signal, then wait a period all the channels to turn on and settle down.

According to one aspect of the two-step VCO calibration method of the present invention, said power-on calibration, comprises binary search, used to locate one channel; storing the result of said binary search to the channel register; judging whether storing all the channels, if false, then going to binary search to locate the other channel.

According to one aspect of the two-step VCO calibration method of the present invention. Said channel or channels have 9 bits.

According to one aspect of the two-step VCO calibration method of the present invention. Said binary search locating one channel, comprises: counting the feed-back divided clock; using the counting result to decide the calibration bits until the first 5 correct bits found to locate the desired channel.

According to one aspect of the two-step VCO calibration method of the present invention. Said judging whether storing all the channels, if true, then said power-on calibration ends and system finally enters into the idle state.

According to one aspect of the two-step VCO calibration method of the present invention. Said real-time calibration shall be triggered by one control signal when system is ready to transmit /receive data packets, then wait a period all the channels to turn on and settle down.

According to one aspect of the two-step VCO calibration method of the present invention. Said real-time calibration, comprises loading the power-on calibration result from channel registers according to current channel setting; binary search, used to locate said current channel.

According to one aspect of the two-step VCO calibration method of the present invention. Said binary search locating said current channel comprises counting the feed-back divided clock; using the counting result to decide the calibration bits until the last 4 correct bits found to locate said current channel.

After the two-step VCO calibration method, feeding the calibration result to VCO and starting to normal synthesizer close-loop operation, finally locking to wanted frequency.

BRIEF DESCRIPTION OF THE DRAWINGS

Other objects, advantages, and novel features of the invention will become more apparent from the following detailed description when taken in conjunction with the accompanying drawing.

DETAILED DESCRIPTION OF THE INVENTION

Although the invention has been explained in relation to several preferred embodiments, the accompanying drawings and the following detailed description are the preferred embodiment of the present invention. It is to be understood that the following disclosed descriptions will be examples of present invention, and will not limit the present invention into the drawings and the special embodiment.

Hereinafter, a special method embodiment is detailed.

Figure 1:
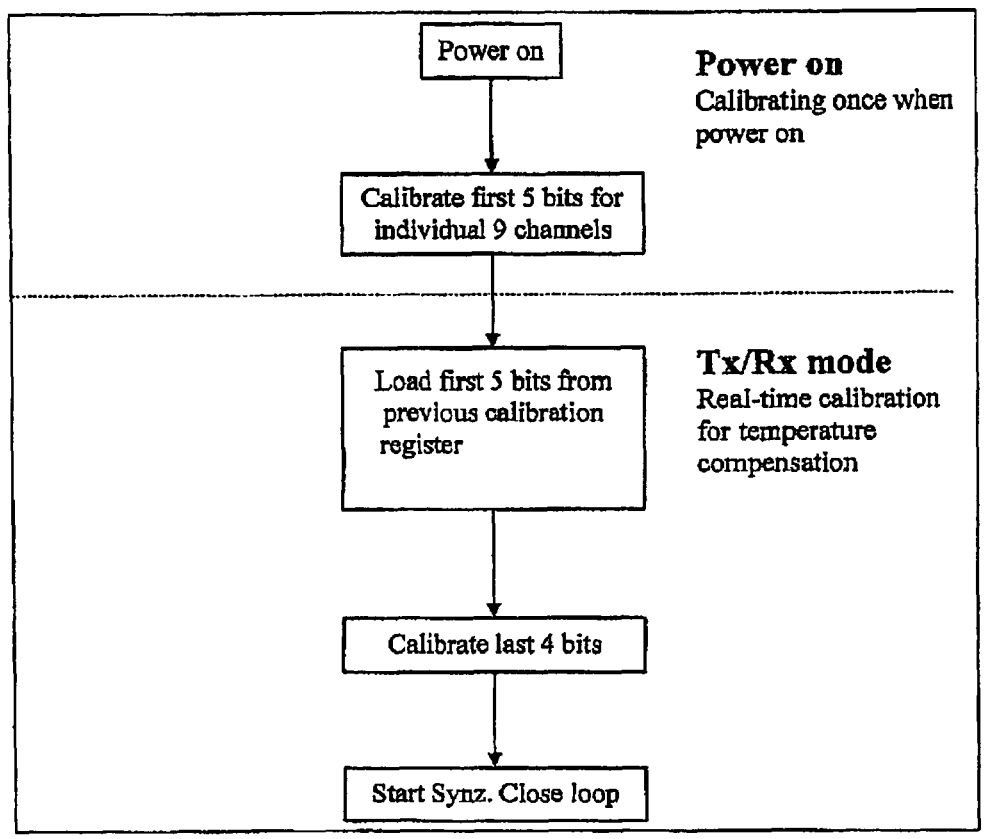
FIG. 1 is a flow-diagram of the two-step VCO calibration method according to the present invention.

FIG. 1 is a flow-diagram of the two-step VCO calibration method according to the present invention. The two-step VCO calibration method comprises power-on calibration, used to calibrate first 5 bits for individual 9 channels and provide a coarse step of VCO tuning; real-time calibration, used to calibrate last 4 bits and provide a real-time calibration with fine VCO tuning. After the real-time calibration, analog phase lock loop starts to lock to wanted frequency.

Figure 2:
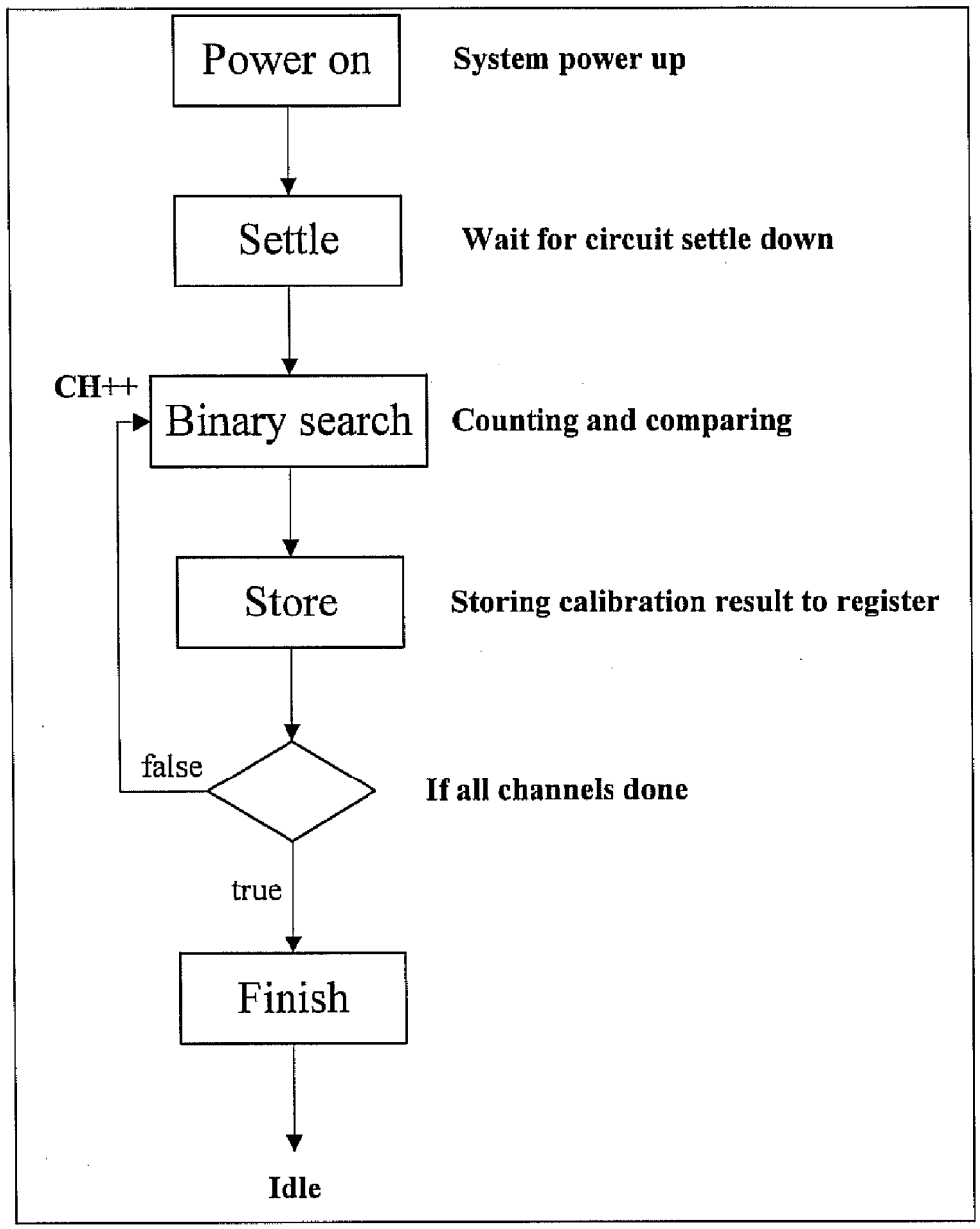
FIG. 2 is a flow-diagram of power-on calibration according to the present invention.

FIG. 2 is a flow-diagram of power-on calibration according to the present invention. When system is power on, one control signal triggers the power-on calibration procedure to start. For supporting totally 79 Bluetooth channels (2402~2480 MHz), here which have 9 bits, 9 registers can be defined to store this wide-frequency range. A small period must be waited for all related circuits, such as VCO, frequency pre-scaler and frequency divider, to turn-on and settle down, then the first channel calibration is been activated. In calibrating a method said binary search is proceeding, which counts the feed-back divided clock and uses the counting result to decide the calibration bits until the first 5 correct bits found to locate the desired channel, and the calibration result will be stored in the register. Then the calibration of next channel follows up. As the first approach, the same binary search actions repeated till all channels are done and stored. If all of the assigned channels are proceeded done, the power-on calibration is completed. System finally enters into the idle state.

Figure 3:
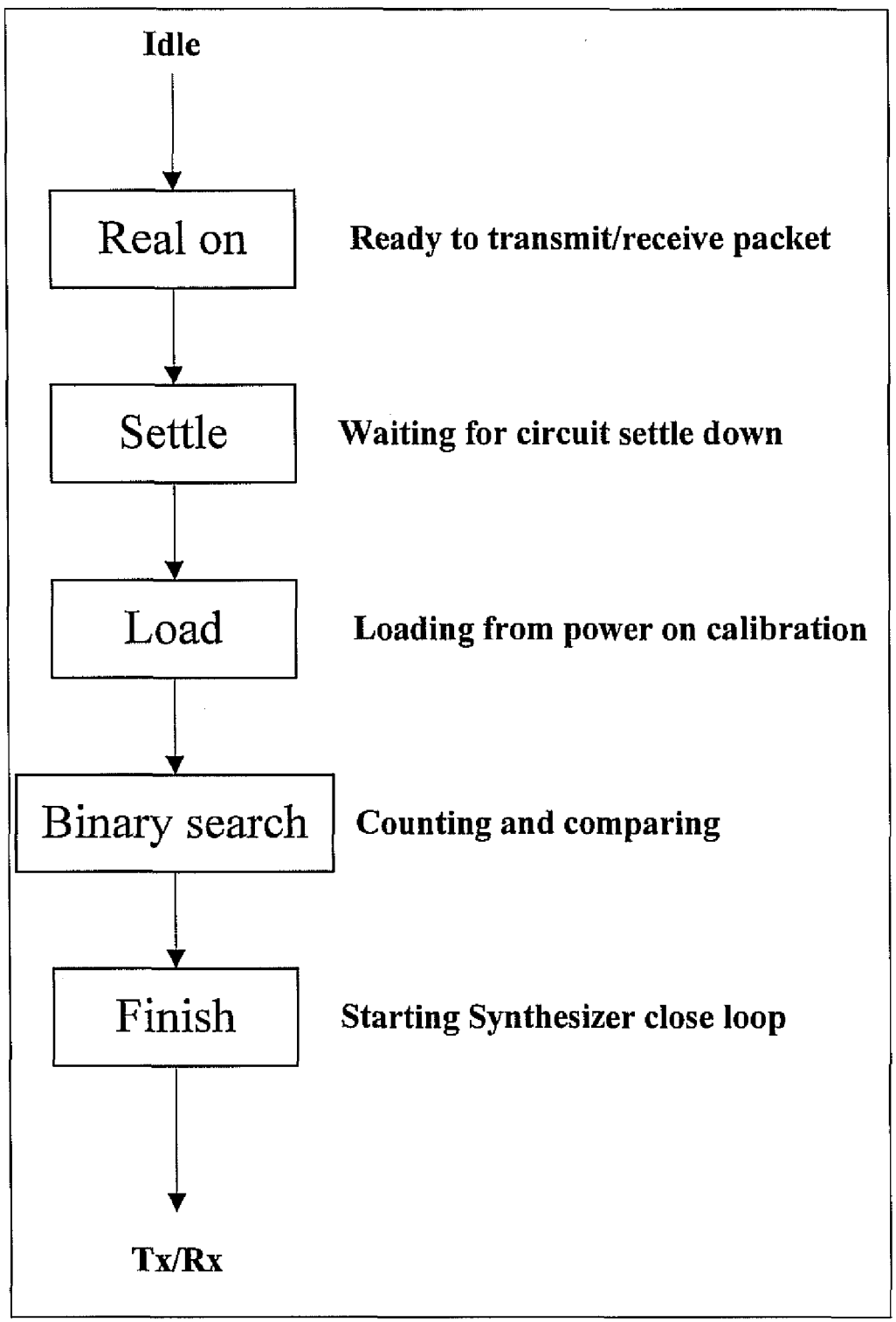
FIG. 3 is a flow-diagram of real-time calibration according to the present invention.

FIG. 3 is a flow-diagram of real-time calibration according to the present invention. After the power-on calibration, the system enters into the idle state. Once the system is ready to transmit or receive packets, the real-time calibration is triggered. The similar procedure with power-on calibration, one period must preserve for circuits such as VCO, frequency pre-scaler and frequency divider, to turn-on and settle down. According to the current channel setting, channel decoder will load from the results of power-on calibration as first 5 VCO trimming bits. In the next step, binary search with counting the feed-back divided clock is going for seeking the last 4 correct bits. When the search is completed, all calibration bits are ready (5+4) and being fed to VCO digital control tuning bits. After experienced this two-step calibration, the PLL (phase lock loop) start to normal close-loop operation. Finally the frequency synthesizer will normal work and lock to a wanted operating frequency, and data packets are sent or received continuously.

Figure 4:
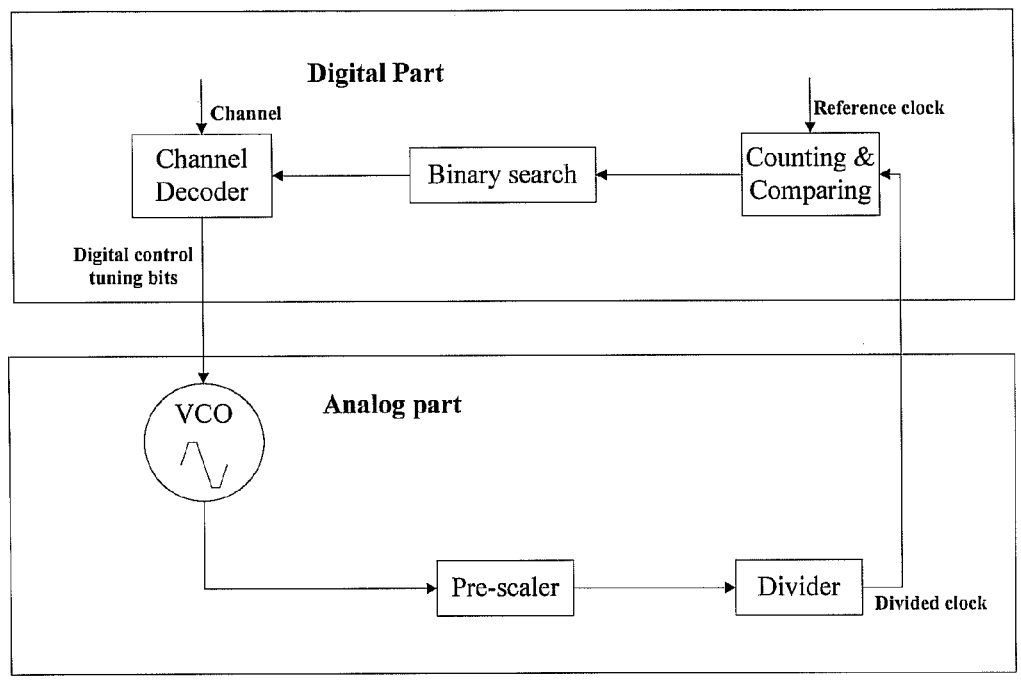
FIG. 4 is a schematic drawing of a calibration loop according to according to the present invention.

In order to understand the above two-step method, a schematic drawing of a calibration loop according to the present invention is shown in FIG. 4. The calibration loop comprises an analog part, composed of VCO, pre-scaler, and frequency divider; and digital implemented parts, composed of counting & comparing module, binary search module and channel decoder. The high frequency output of VCO is fed to pre-scaler and divider chains, which can obtain low frequency output by divided clock. The low frequency is accepted by digital counter block. A binary search module then determines the correct digital control words which direct connect to a set of switch-capacitors that setting the right VCO center frequency.

From the above description, by adopting the two-step method, first 5 bits of the nine channels are coarse-calibrated and stored by the power on calibration procedure, when needed, loading the 5 bits of a current channel and fine-calibrating its last 4 bits by the real-time calibration procedure, finally a 9 bits fine tuning channel will be fed to VCO. Because real-time calibration trace and cover the variation of temperature and loaded the result of power-on calibration, so it has the advantages of covering all the variation of process and temperature, shorter calibration time, smaller gain of VCO, pretty smaller size of passive loop filter, less operating power consumption. The digital control tuning bits as shown in FIG. 4 includes the first five bits and the last four tuning bits.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A two-step VCO calibration method, comprising the steps of: power-on calibration, used to provide a coarse VCO tuning, said power-on calibration being triggered by one control signal, then waiting a period for all channels to turn on and settle down, said power-on calibration comprising;
    binary search, used to locate a first one channel;
    storing a result of said binary search to a channel register;
    judging whether storing all the channels, if false, then going to binary search to locate the other channel;
    wherein said channel or channels have 9 bits;
    wherein said binary search locating said first one channel, comprising:
    counting a feed-back divided clock;
    using the counting result to decide calibration bits until first 5 correct bits found to locate the first channel;
    wherein said judging whether storing all the channels, if true, then said power-on calibration ends and system finally enters into an idle state;
    real-time calibration, used to provide a fine VCO tuning according to loaded result of said power-on calibration, said real-time calibration being triggered by said one control signal when system is ready to transmit/receive data packets, then waiting a period for all the channels to turn on and settle down, said real-time calibration comprising:
    loading the power-on calibration result from the channel register according to a second channel setting;
    binary search, used to locate said second channel;
    wherein said binary search locating said second channel comprising:
    counting the feed-back divided clock;
using the counting result to decide the calibration bits until last 4 correct bits found to locate said second channel.

* * * * *